United States Patent [19]

Knight

[11] 3,964,385
[45] June 22, 1976

[54] UNITARY DEVICE AND METHOD FOR SCREEN MANUFACTURE AND PRINTING

[76] Inventor: Ralph Knight, 3108 McColloch St., Wheeling, W. Va. 26003

[22] Filed: Apr. 3, 1975

[21] Appl. No.: 564,856

[52] U.S. Cl. .............................. 101/128.4; 101/126; 101/128.3
[51] Int. Cl.² ...................... B41C 1/14; B41F 15/20
[58] Field of Search ............. 101/127, 127.1, 128.2, 101/128.3, 128.4, 129, 114, 126

[56] References Cited
UNITED STATES PATENTS

| 2,808,777 | 10/1957 | Roshkind .......................... 101/128.2 |
| 3,161,543 | 12/1964 | Borders et al. .................. 101/126 X |
| 3,267,847 | 8/1966 | Hayama et al. ............... 101/128.4 X |
| 3,372,492 | 3/1968 | Cousins ........................... 101/126 X |

Primary Examiner—Edgar S. Burr
Assistant Examiner—R.E. Suter
Attorney, Agent, or Firm—Thomas E. Beall, Jr.

[57] ABSTRACT

For screen printing, the screen is manufactured and used for printing in a single box. The screen material is coated with a delayed light sensitive emulsion, dried and assembled with a film opaque positive on the outer surface of a glass plate forming one side of the box for exposure to a flood light within the box, with the emulsion delay permitting assembly in normal environment light; the screen may be held down by a resilient foam layer, rigid plate and U-shaped member adjustably secured to the box for this purpose and further to serve as a carrying handle. Thereafter the exposed screen is washed and placed adjacent the outlet of a blower inside the box for the purposes of drying (the emulsion is originally dried in the same manner). Printing is carried out by mounting the thus manufactured screen on a frame pivoted to the box so that the screen may be coated with printing material and engage a paper to be printed lying between the screen and a vacuum plate, which vacuum plate is at the inlet of the blower and will hold the paper on the box when the screen is removed after printing. Other material, such as wood, plastic, metal, etc. not requiring vacuum may also be printed providing they are smooth and flat. This unit will print on objects up to 3 inches thick.

12 Claims, 4 Drawing Figures

UNITARY DEVICE AND METHOD FOR SCREEN MANUFACTURE AND PRINTING

BACKGROUND OF THE INVENTION

Screen printing is a very old process and produces extremely good results. However, an apparatus for screen process printing is quite expensive and complicated for large procedures, and generally homemade for light service. It is known to produce screens for printing with light sensitive emulsions, opaque positives and light exposure; however, this manufacturing process usually requires a dark room, complicated equipment, or is done with great difficulty.

SUMMARY OF THE INVENTION

It is an object of the present invention to produce apparatus and a method whereby a printing screen may be manufactured in environment light and used for printing on a small scale with a minimum amount of equipment that takes up a small space that is highly desirable for these purposes and that is economical.

According to the invention, a box is constructed with one side having a removable glass sheet on which may be stacked an opaque film positive, screen with a delayed photosensitive emulsion, a foam pad or sheet, a rigid backup plate, and a hold down strap so that the screen may be exposed to a flood light within the box for a time sufficient to produce the desired exposure. The screen is thereafter washed to develop the image and placed inside the box to dry. After drying, the screen is pivoted to the box to assume a position with the screen overlying the vacuum plate for printing on material (paper, wood, cloth, plastic - anything flat) therebetween and a position generally perpendicular to the vacuum plate for assembling and removing the paper, as well as for coating the screen. The vacuum plate will hold the material onto the side of the box when the silk screen is removed after printing.

BRIEF DESCRIPTION OF THE DRAWING

Further objects, features and advantages of the present invention will become more clear from the following detailed description of a preferred embodiment, as shown in the accompanying drawing, wherein.

DETAILED DESCRIPTION OF THE PREFERRED EMBODIMENT

Figure 1:
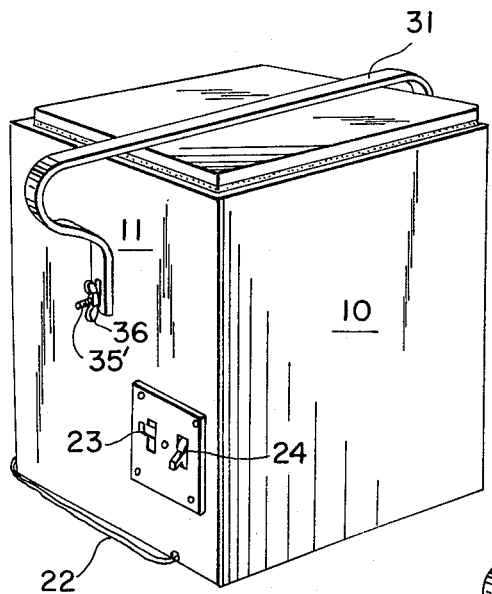
FIG. 1 is a perspective view of the silk screen manufacturing and printing box according to the present invention.
Figure 2:
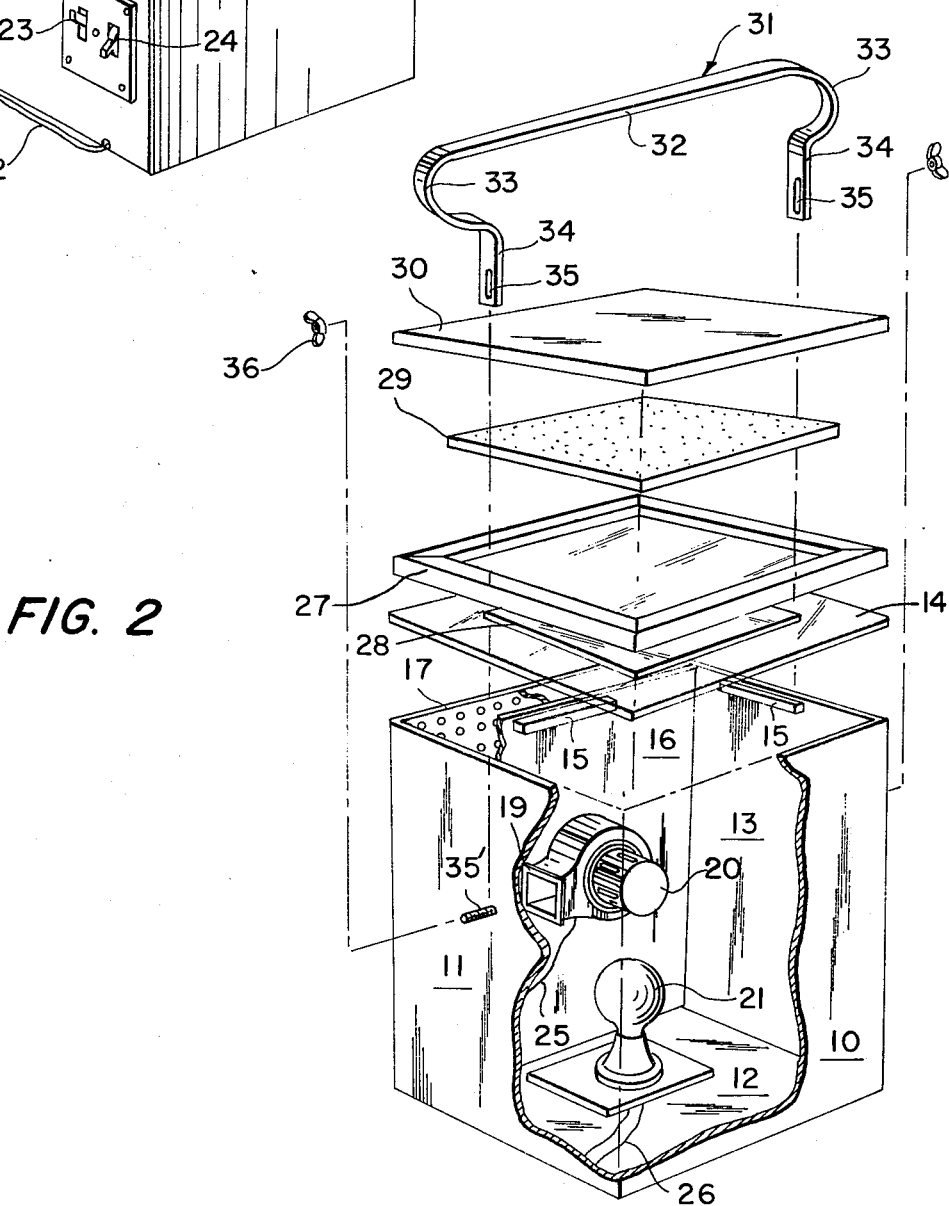
FIG. 2 is a perspective view taken from the same position as FIG. 1, but with a portion of the box cut away to show the interior of the box, and the upper portion of the box exploded to show the construction.

As shown in FIGS. 1 and 2, the box is of generally rectangular construction, which may or may not be square, and of a size that may be easily carried around and placed upon standard tables due to its light weight and small size. The box has six (6) sides. Sides 10, 11, 12 and 13 are formed of rigid material and integrally connected together to form a generally rigid light impervious structure. A removable glass plate 14 forms another side of the box immediately adjacent sides 10, 11, 13 and opposite to side 12. Suitable rests or flanges are provided on the inside surfaces of sides 10, 11, 13 and a partition plate 16 in a common plane parallel to side 12 (the rests 15 for sides 10 and 11 are not shown), for supporting the periphery of glass plate 14. The remaining side of the box is formed by a structure forming a rigid surface perforated throughout substantially its entire extent to constitute a vacuum plate 17 shown in FIG. 3; such a construction may be formed by a rigid perforated plate (for example, a metal plate with holes drilled in it) firmly secured to the walls 11, 12, 13 by tacks, glue, or the like (for example, screws 18) to the adjacent edges.

The partition plate 16 is rigidly secured to the adjacent sides 11, 12, and 13 in spaced parallel relationship to the side 17, to form therebetween a vacuum chamber a rectangular plate, that is horizontally and partially broken away in FIG. 2 to reveal the vacuum plate 17, is sealed between the upper edges of the partition plate 16 and the side or vacuum plate 17 to extend for their full lengths and to seal the vacuum chamber. Outside air is drawn through the perforated side 17 into the thus formed vacuum chamber by means of a blower 19 driven by a suitable motor 20. The air is withdrawn from the vacuum chamber and discharged to the interior of the box by the blower 19 from where it will escape through side 14 with the glass removed to the environment.

A photographic flood light 21, of conventional construction, is mounted on the side 12 opposite from the side 14.

A conventional electric power supply line 22 shown in FIG. 1 has a conventional outlet plug (not shown) on its outer end, extends through wall 11, and has its opposite end (not shown) connected to each of the switches 23, 24 in a conventional manner. Electric wires 25 extend between the motor 20 and switch 23, and electric wires 26 extend between the flood light 21 and the switch 24. Thus, the switch 23 may be used to turn on and off the blower motor 20 and the switch 24 may be used to turn on and off the flood light 21.

As shown in FIG. 2, an opaque - positive 27 taped to glass, a photosensitive coated fabric 28 stretched on a frame, a resilient foam, preferably foam rubber, sheet 29, and a rigid plate 30 may be stacked in order on top of the glass side 14 and secured in such position by a generally U-shaped strap 31. The strap 31 has a web portion 32, reverse bend portions 33, and leg portions 34. The web portion 32 extends across the exterior of the rigid plate 30, and the leg portions 34 extend respectively along the exterior of the sides 13 and 11. At the terminal end of each leg portion 34, there is provided a slot 35 elongated in the direction perpendicular to the sides 12 and 14 for receiving therein at 35' threaded studs (only one being shown) that extend outwardly from the outer surface of the walls 11, 13. Wing nuts 36 are threaded onto the studs 35' to secure the strap 31 in adjusted position.

Figure 4:
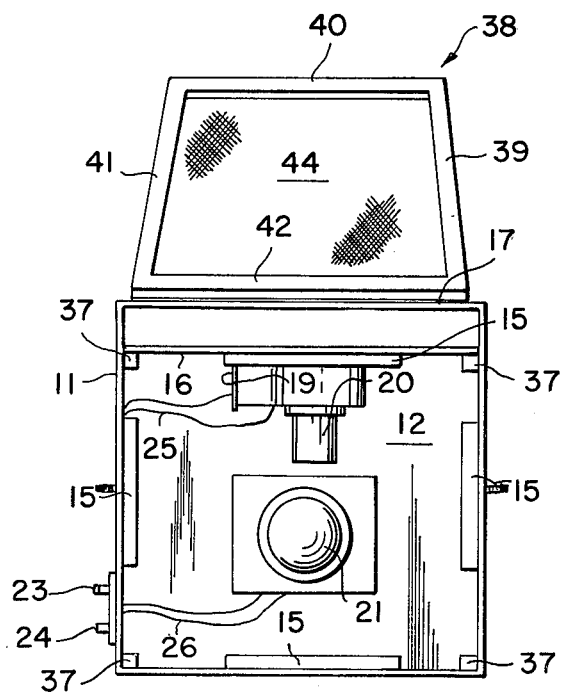
FIG. 4 is an elevation view of the box indicated by line IV-IV in FIG. 3, taken as, with the parts exploded in FIG. 2 being removed to show the interior of the box.

As shown in FIG. 4, posts 37 may extend substantially along the adjacent sides of their respective walls in the corners of the box to further form a rigid structure, and the ends shown in FIG. 4 may be in the same plane as supports 15 for further supporting the glass plate 14.

Figure 3:
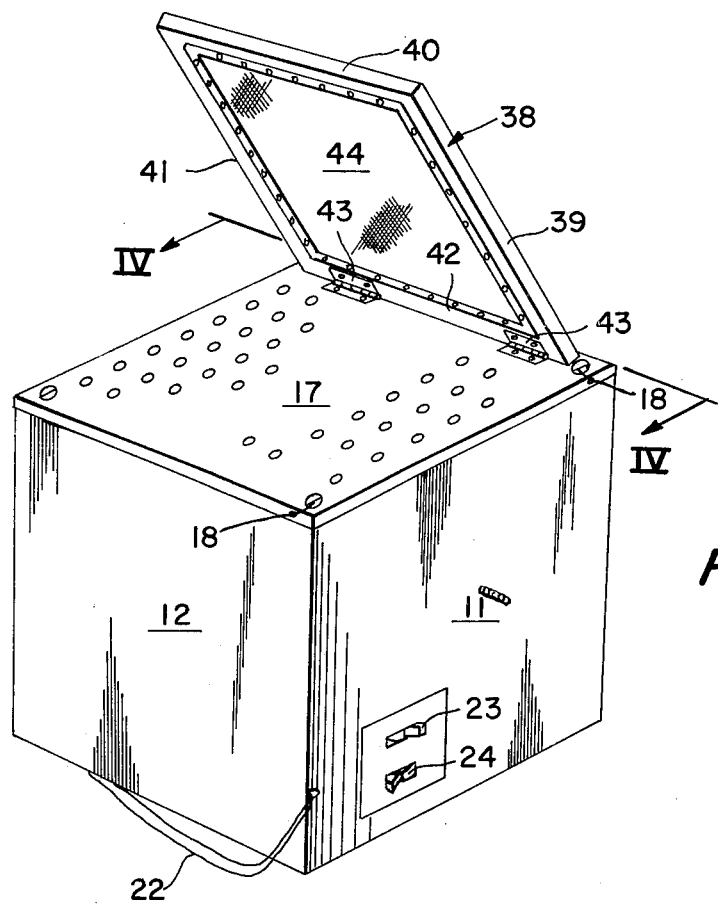
FIG. 3 is a perspective view of the box from a different angle than FIGS. 1 and 2.

As shown in FIGS. 3 and 4, a rectangular open centered frame 38 having sides 39, 40, 41 and 42 rigidly connected together is secured by means of hinges 43 to the box for pivotal movement between the illustrated open position and a position parallel to the side 17. The printing screen 44 is stapled or the like around its entire periphery to the frame 38 in stretched condition so that when the frame is pivoted downwardly parallel to the side 17, the screen 44 will be in overlying contact with the vacuum plate side 17.

OPERATION

In manufacturing a fabric screen for printing, a suitable screen material is mounted on frames 39, 40, 41, 42 and coated with a delay photosensitive emulsion; the emulsion may be dried on the screen by placing the screen in front of the blower outlet inside the box after removing the glass and turning on the blower switch 23. After drying, the screen with the emulsion 28 may be assembled with a film positives having the designs to be reproduced in the position shown in FIG. 2 so that the various layers 14, 27, 28, 29, 30 may be tightly stacked and securely held in position as shown in FIG. 1 by pulling down on the legs 34 and securing them in this position by tightening the wing nuts 36. The screen 28 will be tightly held onto the stencil 27 in this manner and uniformly by the resiliency of the foam sheet 29 and the spring characteristics of the reverse bend portions 33. The strap 31 is constructed of a spring like material, which may be either plastic or metal. Since the emulsion is delayed and not very sensitive to light, this entire assembly may be conducted in the normal environment light. Thereafter, the flood light 21 is turned on. The emulsion may be such that the normal photographic flood light 21 may have an on-period of three minutes to properly expose the emulsion on the screen 28.

After exposure, the layers 27, 28, 29, 30 are disassembled and the screen 28 is removed and washed for development. The wet developed screen is then dried by placing it inside the box after removing the glass and turning on the blower switch 23.

For printing, the liquid printing material is coated onto the screen 44 of FIG. 3 (after it has been exposed, developed and dried). The material to be printed (not shown) is thereafter placed on the vacuum plate 17, the frame 38 is pivoted downwardly into its position parallel to the vacuum plate 17 for engaging the screen with a material to be printed, and in a conventional manner pressure is applied to the opposite side of the screen to perform the printing operation. Thereafter, the frame 38 is pivoted upwardly away from the material thus printed, preferably with the blower being operative to hold the material thus printed down onto the vacuum plate so that it will not stick to and travel with the screen being pivoted upwardly. The material thus printed may be immediately removed.

While a preferred embodiment of the present invention has been set forth in detail for purposes of illustration and for the desirability of the details themselves, further variations, modifications and embodiments are contemplated according to the broader aspects of the present invention, all as determined by the spirit and scope of the following claims.

What is claimed is:

1. Apparatus for use in manufacturing a printing screen and printing with the screen, comprising: a generally rectangular box having six sides forming an enclosed interior; said box including means for manufacturing a printing screen, with said means including a glass plate forming a first side of said box for receiving thereon film positives and a light sensitive stretched screen for reproducing the pattern of the positives, means for uniformly holding the light sensitive screen and positives onto the outside of said glass plate and shielding the light sensitive screen from light to the exterior of said box, and electric light means for producing an exposure light within said box that will shine through said glass plate and the positives to the light sensitive screen for exposure; and means for printing with the printing screen, with said means including a vacuum plate forming a second side of said rectangular box and being air permeable throughout the major portion of its extent, blower means for pulling outside environment air through said second side vacuum plate and into the box, and means for mounting the printing screen to overlie the exterior of said vacuum plate with the material to be printed on between said screen and the vacuum plate.

2. The apparatus of claim 1, including a partition spaced from and parallel to said second side for forming therebetween a vacuum chamber, and wherein said blower means is mounted to draw air from said vacuum chamber through said partition to the interior of said box.

3. The apparatus of claim 1, wherein said first and second sides are immediately adjacent each other and said electric light means is mounted on the side opposite from said first side.

4. The apparatus of claim 1, wherein said means for mounting said printing screen includes a rectangular frame having said printing screen secured thereon, and means hingedly mounting said frame and printing screen onto said box for movement between a position overlying said second side and a position generally perpendicular to said second side.

5. The apparatus of claim 1, wherein said means for holding includes a resilient foam sheet substantially co-extensive with said glass plate and overlying said glass plate on the outside, a rigid plate mounted on the side of said foam sheet opposite from said glass plate, and means securely holding said rigid plate, said foam sheet and said glass plate in stacked relationship on said first side of said box.

6. The apparatus of claim 5, wherein said last mentioned means includes a generally U-shaped strap having a web portion in engagement with and extending across said rigid plate on the exterior of said box, leg portions extending along opposite sides of said box different from said one side and immediately adjacent said second side, and means for mounting said legs on said opposite sides, respectively, for limited relative movement between said legs and sides along respective lines generally perpendicular to said first side and for securing said legs to their respective sides in a selected position along said lines.

7. The apparatus of claim 6, wherein said means for securing includes threaded studs extending outwardly from said opposite sides through elongated slots in the respective legs and fasteners threaded onto said studs, and said elongated slots being sufficiently elongated so that said web portion may be pulled down tightly across said plate in one position of said slot and studs and moved to a second position of said studs in said slots wherein said web portion is substantially spaced from and parallel to said rigid plate to provide a carrying handle for said box.

8. A method of screen printing, comprising the steps of: assembling a screen with a delayed photosensitive coating on one side facing a glass plate forming one side of a rectangular box, with a desired positive copy between the screen and plate, all in normal environmental light; exposing the coating of the assembled screen with light passing from a source within the box through the glass plate and positive copy for a time sufficient to form the desired exposure of the screen; removing the thus exposed screen and washing the screen for development purposes; drying the washed screen; mounting the screen to a screen frame; coating the dried screen with liquid printing material for screen printing; mounting the screen and frame to overlie a second side of the box; thereafter mounting a member to be printed between the coated screen and a work support plate forming the second side of the box; applying pressure with a squeegee across the surface of the screen to transfer at least some of the liquid printing material through the screen onto the member; and thereafter removing the screen and frame from the printed member and the work support plate.

9. The method of claim 8, wherein said step of mounting the screen and frame to overlie a second side of the box includes the further step of hingedly mounting said screen frame onto said box for pivotal movement between the position overlying the vacuum plate and a position extending generally perpendicular to the vacuum plate.

10. The method of claim 8, further including resiliently supporting the coated screen generally across its entire surface opposite from said positive copy and glass plate during exposure to the light from the light source within the box.

11. The method of claim 8, wherein the drying step includes placing the thus washed and therefor wet screen in the box and passing drying air from said blower against said screen for a time sufficient to dry said screen before the step of coating.

12. The method according to claim 8, wherein said step of removing the screen and frame from the printed member includes the step of drawing air through perforations in the work support plate into the box for holding the printed member on the work support plate by vacuum as the screen is removed.

* * * * *